United States Patent [19]
Tanahashi et al.

[11] Patent Number: 6,060,664
[45] Date of Patent: May 9, 2000

[54] ELECTRONIC CIRCUIT COMPONENT

[75] Inventors: Shigeo Tanahashi; Tokuichi Yamaji, both of Kyoto, Japan

[73] Assignee: Kyocera Corporation, Kyoto, Japan

[21] Appl. No.: 09/106,192

[22] Filed: Jun. 26, 1998

[30] Foreign Application Priority Data

Jun. 30, 1997 [JP] Japan ..................................... 9-174861

[51] Int. Cl.$^7$ ........................... B32B 15/08; B32B 15/20; H01B 12/06
[52] U.S. Cl. ....................... 174/125.1; 365/162; 365/160; 428/457; 428/334
[58] Field of Search ..................................... 428/671, 674, 428/662, 660, 457, 421, 422, 689, 704, 334, 411.1, 461; 257/31; 326/3; 327/367; 505/190, 220, 230, 806, 817, 832; 438/622, 648, 656; 174/125.1; 365/162, 160

[56] References Cited

U.S. PATENT DOCUMENTS

| 4,075,756 | 2/1978 | Kircher et al. ............................. 29/625 |
| 4,997,719 | 3/1991 | Ohshima et al. ..................... 428/473.5 |
| 5,476,719 | 12/1995 | Sandell et al. ........................... 428/457 |
| 5,774,336 | 6/1998 | Larson ..................................... 361/720 |

FOREIGN PATENT DOCUMENTS

| 1030294 | 2/1989 | Japan . |
| 5304224 | 11/1993 | Japan . |

*Primary Examiner*—Deborah Jones
*Assistant Examiner*—Michael LaVilla
*Attorney, Agent, or Firm*—Loeb & Loeb, LLP

[57] ABSTRACT

A prior-art electronic circuit component comprising an insulating film and a circuit conductive layer made of a superconducting metal suffers low reliability resulting from insufficient adhesion between these layers. An electronic circuit component of the invention comprises an insulating film made of a high polymer material having a dielectric constant of 2.5 or less, a base metal layer formed of copper on the insulating film, having a thickness of 0.01 to 0.3 $\mu$m, and a circuit conductive layer formed of at least one of niobium and niobium nitride on the base metal layer. The electronic circuit component of the invention can accomplish an increased adhesion between the insulating film and the circuit conductive layer. Furthermore, by sequentially forming, on the circuit conductive layer, a conductive-layer coating metal layer made of at least one of aluminum and copper, the insulating film, the base metal layer and the circuit conductive layer, there can be obtained a multi-layered circuit substrate with a superconducting circuit of high density and high-level function.

7 Claims, 1 Drawing Sheet

ELECTRONIC CIRCUIT COMPONENT

BACKGROUND OF THE INVENTION

1. Field of the Invention

The present invention relates to an electronic circuit component and more particularly to an improvement in adhesion between a circuit conductive layer and an insulating film disposed in such an electronic circuit component as a multi-layered circuit substrate, including the insulating film made of a high polymer material between layers and the circuit conductive layer made of a superconducting metal.

2. Description of the Related Art

Conventionally, a circuit conductive layer of an electronic circuit component such as a multi-layered circuit substrate on which a Josephson device made of a superconducting material is mounted, is essentially fabricated by the steps of: forming an insulating film made of a polyimide resin with a relatively small dielectric constant of 3 to 3.5 on a substrate made of such a material having an excellent insluating property as alumina, mullite, silicon or the like; forming thereover a circuit conductive layer made of niobium (Nb), which is a superconducting metal, by means of a thin film forming method based on the vapor phase growth technique such as evaporation, sputtering and the like; and forming a very fine circuit pattern by means of the photolithography technique, so that a multi-layered structure of the insulating film and the circuit conductive layer is fabricated. Thus, a multi-layered circuit substrate featuring a high density and a high-level function as well as permitting a high-speed operation of the superconducting Josephson integrated circuit device has been obtained.

However, as an operation speed of the superconducting Josephson device has increased recently, the dielectric constant of 3 to 3.5 and a dielectric loss of about $20 \times 10^{-5}$ of the conventional polyimide resin have become so great that it is difficult to accomplish a high-speed transmission of signals and, in turn, it is impossible to perform the high-speed operation in the superconducting Josephson device.

With an aim at eliminating such a drawback of the prior-art multi-layered circuit substrate, studies have been made to obtain a multi-layered circuit substrate featuring the high density and the high-level function as well as permitting the high-speed operation of the superconducting Josephson integrated circuit device. For example, such a multi-layered circuit substrate may be fabricated by the steps of: forming, on a ceramic substrate, an insulating film made of a fluorine-containing polymer or a fluorine-containing cycloaliphatic polymer which have a small dielectric constant of about 2.0 and a small dielectric loss of $7 \times 10^{-6}$; forming thereon a circuit conductive layer made of the superconducting metal by means of the thin film forming method based on the vapor phase growth technique such as evaporation, sputtering and the like; and forming a very fine circuit pattern by means of the photolithography technique, so that the multi-layered structure of the insulating film and the circuit conductive layer is fabricated.

However, the following problem exists in the multi-layered circuit substrate using the insulating film made of a high polymer material such as the fluorine-containing polymer or the fluorine-containing cycloaliphatic polymer and using the circuit conductive layer made of the superconducting metal. That is, an adhesion strength is low between the insulating film made of the fluorine-containing polymer or the fluorine-containing cycloaliphatic polymer and the circuit conductive layer made of the superconducting metal, because functional groups composing the fluorine-containing polymer or the fluorine-containing cycloaliphatic polymer are bonded with atoms of the superconducting metal of the circuit conductive layer in a thermally unstable state. As a result, the multi-layered circuit substrate suffers a poor reliability.

SUMMARY OF THE INVENTION

The present inventors have carried out various tests in the pursuit of solution to the above problem to find a process to achieve an improved adhesion between an insulating film and a circuit conductive layer. The process essentially includes the steps of forming a base metal layer of copper (Cu) on the insulating film by means of the vapor phase growth technique, forming thereon a circuit conductive layer made of at least one of niobium and niobium nitride (NbN) by means of the vapor phase growth technique, and forming a circuit pattern by means of the photolithography technique.

The invention has been accomplished based on the finding above-mentioned and has an object to provide an electronic circuit component having good adhesion between the insulating film and the circuit conductive layer made of the superconducting metal, as well as good insulating reliability of the insulating film.

In a first aspect of the invention, an electronic circuit component comprises:

- an insulating film made of a high polymer material having a dielectric constant of 2.5 or less;
- a base metal layer made of copper having a thickness of 0.01 to 0.3 $\mu$m, the base metal layer being laid over the insulating film; and
- a circuit conductive layer made of at least one of niobium and niobium nitride, the circuit conductive layer being laid over the base metal layer.

According to the first aspect of the invention, the electronic circuit component has a construction in which the base metal layer made of copper is laid over the insulating film made of the high polymer material so as to serve as a base for the circuit conductive layer made of at least one of the superconducting metals of niobium and niobium nitride. As a result, the conductive layer of niobium or niobium nitride formed by the vapor phase growth technique has an adhesion strength of about 1 kg/mm$^2$ to the insulating film, while the conductive layer of copper formed by the same vapor phase growth technique has a high adhesion strength of about 2 kg/mm$^2$ to the insulating film. Thus, the adhesion between the insulating film and the circuit conductive layer is sufficiently improved to provide an electronic circuit component with a high reliability.

In the case where the copper base metal layer has a thickness of less than 0.01 $\mu$m, the copper layer is diffused together with the superconducting metal of the circuit conductive layer due to heat for curing a resin material of another insulating film which is laminated and formed over these layers, with the result that the circuit conductive layer directly contacts the insulating film and an adhesion failure may occur. On the other hand, in the case where the copper base metal layer has a thickness of greater than 0.3 $\mu$m, when, for example, a high-frequency electric signal of a sinusoidal wave at 10 GHz (equivalent to a rectangular-wave signal at about 3 GHz in logic circuit) is transmitted through the circuit conductive layer, more than half of the propagated electromagnetic wave component in a part of the propagated electromagnetic wave travels through the copper base metal layer due to the skin effect (a thickness of 0.66 $\mu$m in this case). As a result, the high-frequency electric signal is attenuated because a resistance of the copper base metal layer exceeds that of the circuit conductive layer, so that a malfunction of the superconducting Josephson device mounted to this electronic circuit component may occur. For this reason, the thickness of the copper base metal layer should be limited within a range of 0.01 to 0.3 μm.

The electronic circuit component of the invention has accomplished a sufficient degree of improvement in adhesion between the insulating film and the circuit conductive layer, thereby to afford an electronic circuit component having a superconducting circuit of high density and high-level function.

Thus, the invention provides an electronic circuit component featuring an excellent adhesion between the insulating film and the circuit conductive layer made of the superconducting metal of niobium or niobium nitride, as well as featuring a high reliability of the insulating film.

In a second aspect of the invention, in the above construction of the electronic circuit component the insulating film is made of a fluorine-containing polymer.

In a third aspect of the invention, in the above construction of the electronic circuit component the insulating film is made of at least one of fluorine-containing polymers as shown in the following chemical formulae 1 to 4, each having a principal chain of a fluorine-containing cycloaliphatic structure:

[Chemical Formula 1]

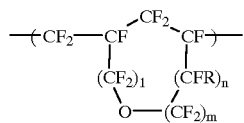

wherein '1' denotes an integer of 0 to 5, 'm' denotes an integer of 0 to 4, 'n' denotes an integer of 0 to 1, 'l+m+n' denotes an integer of 1 to 6, and 'R' denotes F or $CF_3$;

[Chemical Formula 2]

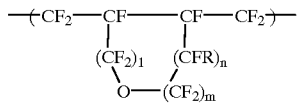

wherein '1' denotes an integer of 0 to 5, 'm' denotes an integer of 0 to 4, 'n' denotes an integer of 0 to 1, 'l+m+n' denotes an integer of 1 to 6, and 'R' denotes F or $CF_3$;

[Chemical Formula 3]

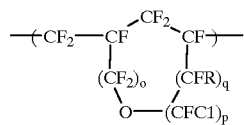

wherein each of 'o', 'p' and 'q' denotes an integer of 0 to 6, and 'o+p+q' denotes an integer of 1 to 6; and

[Chemical Formula 4]

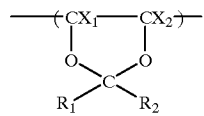

wherein each of '$R_1$' and '$R_2$' denotes F or $CF_3$, and each of '$X_1$' and '$X_2$' denotes F or Cl.

According to the second and third aspects of the invention, it is preferable that the electronic circuit component is constructed so as to have the insulating film of the fluorine-containing polymer, and more preferably, so as to have at least one of the fluorine-containing polymers as shown in chemical formulae 1 to 4, each having the principal chain of the fluorine-containing cycloaliphatic structure. Such an insulating film has a quite small dielectric constant of 2.0, a small dielectric loss of not greater than $7 \times 10^{-6}$, and a water absorption of 0.1% or less. Therefore, this insulating film presents a propagation-delay time ($T_{pd}$) of 47 ps/cm, which is smaller than $T_{pd}$=60 ps/cm in the prior-art insulating film of a polyimide resin material ($\epsilon_r$=3.3), the propagation-delay time given by the expression of $T_{pd}$= ($\sqrt{\epsilon_r}$)/C. Thus, the electronic circuit component of the invention is adapted to speed up the operation between devices. Furthermore, by virtue of such a small water absorption of 0.1% or less, the electronic circuit component of the invention is free from dielectric constant fluctuations due to moisture in the operating environment, so as to accomplish a stable operation, a high reliability and a high-level function.

Hence, the electronic circuit component according to the invention provides a high-speed transmission of signals and a stable operation of devices thereof which is unsusceptible to the moisture in the operating environment.

In a fourth aspect of the invention, in the above construction of the electronic circuit component some of functional groups of the fluorine-containing polymer have an alkyl group which is added thereto and contains at least one of nitrogen, sulfur and phosphorus.

According to the fourth aspect of the invention, the electronic circuit component may employ the insulating film of the fluorine-containing polymer having the alkyl group which is added thereto and contains at least one of nitrogen, sulfur and phosphorus. Such an insulating film presents an identical effect to the insulating film of the fluorine-containing polymer free from the alkyl group containing at least one of nitrogen, sulfur and phosphorus.

In a fifth aspect of the invention, the electronic circuit component is characterized in that the insulating film has a water absorption of 0.1% or less.

According to the fifth aspect of the invention, the electronic circuit component comprises the insulating film having a low water absorption of 0.1% or less, so that the electronic circuit component is free from the dielectric constant fluctuations due to the moisture in the operation environment to ensure a stable operation as well as a high reliability and a high-level function.

In a sixth aspect of the invention, the electronic circuit component is characterized in that a conductive-layer coating metal layer made of at least one metal of aluminum and copper is formed on the circuit conductive layer.

According to the sixth aspect of the invention, the electronic circuit component has a construction in which the base coating metal layer made of at least one metal of aluminum and copper is formed on the circuit conductive layer. This coating metal layer serves to protect the circuit conductive layer made of at least one of niobium and niobium nitride, and besides, sufficiently improves an adhesion between the layers in a case of forming an additional insulating film on the coating metal layer.

In a seventh aspect of the invention, the electronic circuit component is characterized in that, on the base coating metal layer the insulating film, the base metal layer, the circuit base and the conductive-layer coating metal layer are sequentially formed to provide a multi-layered circuit structure.

According to the seventh aspect of the invention, the electronic circuit component provides a multi-layered structure of high density and high performance.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
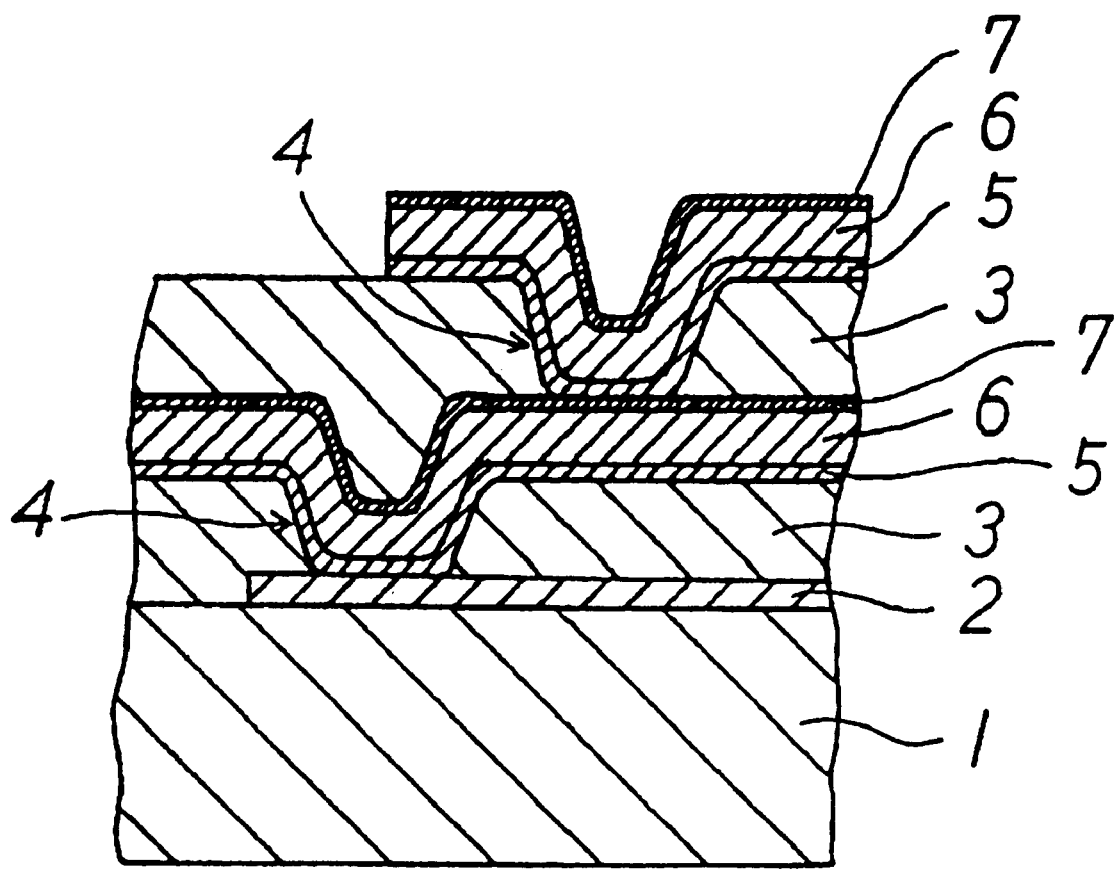
FIG. 1 is a sectional view for illustrating an electronic circuit component according to an embodiment of the invention.

Now referring to the drawings, preferred embodiments of the invention are described below.

FIG. 1 is a sectional view for illustrating an electronic circuit component according to an embodiment of the invention. An insulating substrate 1 is fabricated by the steps of: preparing a paste by mixing a suitable solvent or solvent medium with powder of such a raw material for ceramic as alumina ($Al_2O_3$), silica ($SiO_2$) and the like; shaping the paste into a form of sheet by means of the known doctor blade coating method; and baking the sheet-like paste at a high temperature.

On a top surface of the insulating substrate 1, a lower conductive layer 2 made of a metal such as aluminum (Al) is formed by the vapor phase growth technique such as ion plating, sputtering and the like. The lower conductive layer 2 is subject to spin coating for covering its top surface with a high polymer material made of at least one of the fluorine-containing polymers of the aforesaid chemical formulae 1 to 4, each having the principal chain of the fluorine-containing cycloaliphatic structure, for example. Subsequently, the high polymer material is heat-treated to form an insulating film 3 over the lower conductive layer 2.

The insulating film 3 is made of a high polymer material having a dielectric constant of 2.5 or less. In order to have a plurality of devices operated at a clock frequency of 3 GHz, for example, the prior-art insulating film of a polyimide resin material having a dielectric constant $\epsilon_r=3.3$ must restrict a mounting area of a device to 4 square centimeters or less for accomplishing a signal transmission between devices within one clock cycle, because a propagation-delay time of the insulating film of a polyimide resin material is about 60 ps/cm. In contrast, the insulating film having a dielectric constant $\epsilon_r=2.0$ allows the mounting area of a device to be expanded to 5 square centimeters. Thus, the insulating film of the invention can sufficiently meet the electronic circuit component upsized due to a provision of a higher-level function with the device.

A variety of high polymer materials having the dielectric constant of 2.5 or less are applicable to the insulating film 3 of the electronic circuit component of the invention. In particular, a fluorine-containing polymer and a fluorine-containing cycloaliphatic polymer, above all, the fluorine-containing polymers as shown in chemical formulae 1 to 4, each having the principal chain of the fluorine-containing cycloaliphatic structure are preferred.

The fluorine-containing polymer, and the fluorine-containing polymers represented by chemical formulae 1 to 4 and having the principal chains of the fluorine-containing cycloaliphatic structures, have a smaller dielectric constant, a smaller dielectric loss and a lower water absorption. Accordingly, such polymers realize an electronic circuit component permitting a high-speed operation as well as a stable operation without fluctuations of the dielectric constant due to the operating environment.

Next, in order to fabricate a multi-layered structure, an interconnecting via hole 4 or the like is formed by means of, for example, the photolithography technique.

Subsequently, by means of the vapor growth technique, a base metal layer 5 made of copper is formed on the insulating film 3, and then a main conductive layer 6 made of at least one of the superconducting metals of niobium and niobium nitride is formed on the base metal layer 5.

The base metal layer 5 made of copper does not magnetically affect niobium or niobium nitride of the main conductive layer 6 serving as a superconductor, so that a superconducting property thereof is not degraded. Furthermore, the base metal layer presents a good adhesion to the insulating film 3.

Since the main conductive layer 6 of the circuit conductive layer is made of at least one of niobium and niobium nitride, and hence a high speed electric signal is transmitted through the main conductive layer 6 serving as a superconducting circuit, there occurs no attenuation in a signal level due to resistance of the conductor. This permits a stable operation of the device.

Over the main conductive layer, there is formed a base coating metal layer 7 made of at least one metal of aluminum and copper by means of the vapor phase growth technique. Thereafter, a circuit pattern is formed by means of the photolithography technique. By sequentially forming thereon another insulating film 3 and another circuit pattern in lamination, the multi-layered circuit substrate according to the electronic circuit component of the invention can be obtained.

Needless to say, the circuit conductive layer of the electronic circuit component of the invention is essentially made of the main conductive layer 6, but a combination of the main conductive layer 6 with the base metal layer 5 and the base coating metal layer 7 may function as the circuit conductive layer.

EXAMPLE

Now, an effect of the invention will be described with reference to an example hereof.

(Preparation of Evaluation Samples)

On a surface of an insulating substrate made of alumina ceramics having a thickness of 0.635 mm and dimensions of 50-mm square, a film of aluminum was formed so as to have a thickness of 1 $\mu$m by sputtering, and a lower conductive layer pattern was formed by means of the photolithography technique.

Subsequently, a cyclized polyethylene fluoride resin was applied by spin coating onto each surface of the insulating substrate and lower conductive layer pattern, and was heat-treated at 300° C. to form a 3-$\mu$m-thick insulating film.

Subsequently, on this insulating film, a film of copper having a thickness shown in Table 1, a film of niobium having a thickness of 1 to 3 $\mu$m and further a film of copper having a thickness of 2 to 3 $\mu$m were sequentially formed by means of sputtering, respectively serving as a base metal layer, a circuit conductive layer and a conductive-layer coating metal layer.

Thereafter, by means of the photolithography technique, 100 pieces of 1-mm-square patterns for adhesion evaluation were defined at 1-mm intervals for each insulating substrate, so that samples for adhesion evaluation were obtained.

(Method for Evaluating Adhesion)

Using a eutectic solder containing tin and lead in a ratio of 60:40, a copper wire having a diameter of 0.2 mm was connected to each adhesion evaluation pattern of each adheion evaluation sample in a perpendicular position with respect to the insulating substrate.

The copper wire was pulled in a perpendicular direction with respect to the surface of the insulating substrate to determine an adhesion strength of each adhesion evaluation pattern by means of an adhesion-strength measuring instrument.

Since the measurements were given in kilograms while the adhesion evaluation pattern had the dimensions of 1-mm-square, the adhesion strength of each adhesion evaluation pattern was given on a basis of $kg/mm^2$. For each of the adhesion evaluation samples, an average value of the adhesion strengths of all of the adhesion evaluation patterns was found as an adhesion strength of the respective samples. Here, as a standard of the electronic circuit component of high reliability with an excellent adhesion of the circuit conductive layer, a sample presenting an adhesion strength of 2 $kg/mm^2$ or more was regarded as acceptable.

Further, as described in the foregoing, a part of the electromagnetic wave (high-frequency signal) propagating through the circuit conductive layer made of niobium or niobium nitride also travels through the base metal layer of copper due to the skin effect. Hence, as the thickness of the base metal layer is increased, a greater proportion of the electromagnetic wave component enters the base metal layer, thereby to be attenuated by the electrical resistance of the copper. Therefore, in a case where a high-frequency electric signal at 10 GHz was propagated, a proportion of the electromagnetic wave component attenuated at the base metal layer was determined for each evaluation sample. A sample in which the proportion was ½ or less was defined to be less susceptible to the skin effect and thus to be acceptable.

The results are shown in Table 1, in which the symbol ○ indicates a good evaluation result in the skin effect.

TABLE 1

| Sample No. | Base metal layer ($\mu$m) | Adhesion strength ($kg/mm^2$) | Skin effect |
| --- | --- | --- | --- |
| *1 | 0 | 1.1 | ○ |
| *2 | 0.008 | 1.2 | ○ |
| 3 | 0.01 | 2.5 | ○ |
| 4 | 0.02 | 2.1 | ○ |
| 5 | 0.08 | 2.3 | ○ |
| 6 | 0.20 | 2.2 | ○ |
| 7 | 0.24 | 2.3 | ○ |
| 8 | 0.30 | 2.5 | ○ |
| *9 | 0.40 | 2.5 | X |
| *10 | 0.50 | 2.7 | X |
| *11 | 0.70 | 2.3 | X |

Note: The symbol * denotes a sample wherein the base metal layer has a thickness other than specified by the invention.

As apparent from Table 1, sample No. 1 without the base metal layer of copper and sample No.2 with the base metal layer less than 0.01 $\mu$m in thickness presented an adhesion strength of less than 2 $kg/mm^2$ and hence were not applicable to practical use.

In samples Nos. 9 to 11, each having the base metal layer greater than 0.3 $\mu$m in thickness, though adhesion strengths thereof were favorable, more than ½ of the electromagnetic wave was attenuated at the base metal layer due to the skin effect. These samples were regarded as unacceptable (X), and likewise to the above, were not applicable to practical use.

In contrast, each of the samples Nos. 3 to 8, which are the electronic circuit components of the invention, presented a high adhesion strength of more than 2 $kg/mm^2$, to accomplish an excellent adhesion of the circuit conductive layer to the insulating film as well as a high reliability. In addition, these samples presented small attenuations of the high-frequency signal at the base metal layer due to the skin effect, and an excellent signal transmitting characteristic.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An electronic circuit component comprising:

a first insulating film made of a high polymer material having a dielectric constant of 2.5 or less;

a first base metal layer made of copper having a thickness of 0.01 to 0.3 $\mu$m, the base metal layer being laid over the insulating film; and a first circuit conductive layer comprising at least one superconducting material selected from the group consisting of niobium and niobium nitride, the circuit conductive layer being laid over the base metal layer.

2. The electronic circuit component of claim 1, wherein the insulating film is made of a fluorine-containing polymer.

3. The electronic circuit component of claim 2, wherein the insulating film is made of at least one of fluorine-containing polymers as shown in chemical formulae 1 to 4, each having a principal chain of a fluorine-containing cycloaliphatic structure:

[Chemical Formula 1]

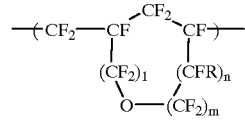

wherein 'l' denotes an integer of 0 to 5, 'm' denotes an integer of 0 to 4, 'n' denotes an integer of 0 to 1, 'l+m+n' denotes an integer of 1 to 6, and 'R' denotes F or $CF_3$;

[Chemical Formula 2]

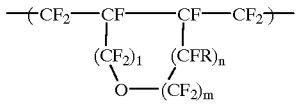

wherein 'l' denotes an integer of 0 to 5, 'm' denotes an integer of 0 to 4, 'n' denotes an integer of 0 to 1, 'l+m+n' denotes an integer of 1 to 6, and 'R' denotes F or $CF_3$;

[Chemical Formula 3]

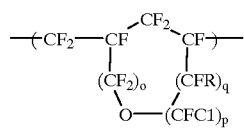

wherein each of 'o', 'p' and 'q' denotes an integer of 0 to 6, and 'o+p+q' denotes an integer of 1 to 6; and

[Chemical Formula 4]

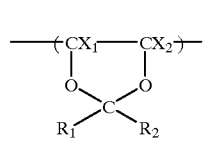

wherein each of '$R_1$' and '$R_2$' denotes F or $CF_3$, and each of '$X_1$' and '$X_2$' denotes F or Cl.

4. The electronic circuit component of claim 2 or 3, wherein some of functional groups of the fluorine-containing polymer have an alkyl group which is added thereto and contains at least one element selected from the group consisting of nitrogen, sulfur and phosphorus.

5. The electronic circuit component of claim 1, wherein the insulating film has a water absorption of 0.1% or less.

6. The electronic circuit component of claim 1, wherein a base coating metal layer made of at least one metal selected from the group consisting of aluminum and copper is formed over the circuit conductive layer.

7. The electronic circuit component of claim 6, wherein, on the base coating metal layer a second insulating film, a second base metal layer, a second circuit conductive layer and a second coating metal layer are sequentially formed to provide a multi-layered circuit structure, wherein the second insulating film, the second base metal layer, the second circuit conductive layer and the second coating metal layer have the same composition as the first insulating film, the first base metal layer the first circuit conductive layer and the first base coating metal layer, respectively.

* * * * *